(12) United States Patent
Matsumura (10) Patent No.: US 9,659,808 B2
(45) Date of Patent: May 23, 2017

(54) SEMICONDUCTOR-ELEMENT MANUFACTURING METHOD AND WAFER MOUNTING DEVICE USING A VACUUM END-EFFECTOR

(71) Applicant: MITSUBISHI ELECTRIC CORPORATION, Tokyo (JP)

(72) Inventor: Tamio Matsumura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/906,286

(22) PCT Filed: Oct. 15, 2013

(86) PCT No.: PCT/JP2013/077989
§ 371 (c)(1),
(2) Date: Jan. 20, 2016

(87) PCT Pub. No.: WO2015/056303
PCT Pub. Date: Apr. 23, 2015

(65) Prior Publication Data
US 2016/0155656 A1   Jun. 2, 2016

(51) Int. Cl.
*H01L 21/683* (2006.01)
*H01L 21/67* (2006.01)
*H01L 21/78* (2006.01)

(52) U.S. Cl.
CPC .... *H01L 21/6836* (2013.01); *H01L 21/67092* (2013.01); *H01L 21/67132* (2013.01);
(Continued)

(58) Field of Classification Search
CPC ........... H01L 21/78; H01L 2221/68327; H01L 2221/68331; H01L 21/304; H01L 2221/68336
See application file for complete search history.

(56) References Cited

U.S. PATENT DOCUMENTS 5,543,365 A * 8/1996 Wills ................. H01L 21/78
148/DIG. 28
5,902,499 A   5/1999 Richerzhagen
(Continued)

FOREIGN PATENT DOCUMENTS

JP   H8330196 A   12/1996
JP   H9066386 A    3/1997
(Continued)

OTHER PUBLICATIONS

Notification of Transmittal of Translation of the International Preliminary Report on Patentability and Translation of Written Opinion of the International Searching Authority; PCT/JP2013/077989 issued on Apr. 28, 2016.
(Continued)

*Primary Examiner* — Thomas L Dickey
*Assistant Examiner* — Damon Hillman
(74) *Attorney, Agent, or Firm* — Studebaker & Brackett PC (57) ABSTRACT

According to the present invention, a semiconductor-element manufacturing method including the steps of cutting out a ring portion of a wafer with laser light to form a flat wafer, the ring portion being formed on a periphery of the wafer and thicker than a central portion of the wafer, the wafer having a first surface and a second surface opposite to the first surface, with the first surface of the wafer being held on a vacuum stage by suction, attaching the first surface to dicing tape after detaching the flat wafer from the vacuum stage with the second surface of the flat wafer being held by a vacuum end-effector by suction, and dicing the flat wafer attached to the dicing tape.

8 Claims, 9 Drawing Sheets

(52) U.S. Cl.
CPC .......... *H01L 21/6838* (2013.01); *H01L 21/78* (2013.01); *H01L 2221/68327* (2013.01); *H01L 2221/68336* (2013.01)

(56) References Cited

U.S. PATENT DOCUMENTS

| | | | | |
|---|---|---|---|---|
| 6,398,892 | B1* | 6/2002 | Noguchi | B24B 7/228 156/154 |
| 2004/0126996 | A1* | 7/2004 | Kobayashi | B28D 5/022 438/460 |
| 2004/0137699 | A1 | 7/2004 | Kurosawa | |
| 2004/0211762 | A1 | 10/2004 | Sekiya et al. | |
| 2005/0142815 | A1 | 6/2005 | Miyazaki et al. | |
| 2005/0163598 | A1 | 7/2005 | Yuasa et al. | |
| 2006/0009008 | A1 | 1/2006 | Kaneuchi et al. | |
| 2007/0051710 | A1 | 3/2007 | Odanaka et al. | |
| 2008/0280421 | A1 | 11/2008 | Nakamura | |
| 2008/0302480 | A1* | 12/2008 | Berger | B29C 63/0013 156/714 |
| 2009/0036034 | A1* | 2/2009 | Sekiya | H01L 21/78 451/55 |

FOREIGN PATENT DOCUMENTS

| | | |
|---|---|---|
| JP | H10-500903 A | 1/1998 |
| JP | 2004268080 A | 9/2004 |
| JP | 2004322168 A | 11/2004 |
| JP | 2006032419 A | 2/2006 |
| JP | 2006286900 A | 10/2006 |
| JP | 2007069249 A | 3/2007 |
| JP | 2007134510 A | 5/2007 |
| JP | 2007281095 A | 10/2007 |
| JP | 2008-177600 A | 7/2008 |
| JP | 2008-283025 A | 11/2008 |
| JP | 2009170797 A | 7/2009 |
| JP | 2009283636 A | 12/2009 |
| JP | 2010212608 A | 9/2010 |
| JP | 2010-239161 A | 10/2010 |
| JP | 2011-009341 A | 1/2011 |
| JP | 2011125871 A | 6/2011 |
| JP | 2011189400 A | 9/2011 |
| JP | 2012054275 A | 3/2012 |
| JP | 2012101230 A | 5/2012 |
| JP | 2013172107 A | 9/2013 |
| TW | 200308038 A | 12/2003 |
| TW | 200416853 A | 9/2004 |
| TW | 2010036051 A1 | 10/2010 |

OTHER PUBLICATIONS

An Office Action issued by the Taiwanese Patent Office on Mar. 9, 2016, which corresponds to Taiwanese Patent Application No. 102142595 and is related to U.S. Appl. No. 14/906,286; with English language partial translation.

An Office Action issued by the Taiwanese Patent Office on Aug. 5, 2015 with English language partial translation.

An Office Action "Notification of Reasons for Rejection" issued by the Japanese Patent Office on Aug. 9, 2016, which corresponds to Japanese Patent Application No. 2015-542431 and is related to U.S. Appl. No. 14/906,286; with partial English language translation.

An Office Action issued by the Taiwanese Patent Office on Oct. 25, 2016, which corresponds to Taiwanese Patent Application No. 102142595 and is related to U.S. Appl. No. 14/906,286; with English language partial translation.

An Office Action; "Notification of Reason for Rejection" issued by the Japanese Patent Office on Dec. 6, 2016, which corresponds to Japanese Patent Application No. 2015-542431 and is related to U.S. Appl. No. 14/906,286; with English language partial translation.

An Office Action issued by the Korean Patent Office on Feb. 8, 2017, which corresponds to Korean Patent Application No. 10-2016-7009742 and is related to U.S. Appl. No. 14/906,286; with English language partial translation.

* cited by examiner

SEMICONDUCTOR-ELEMENT MANUFACTURING METHOD AND WAFER MOUNTING DEVICE USING A VACUUM END-EFFECTOR

TECHNICAL FIELD

This invention relates to a method of manufacturing a semiconductor element such as an IGBT (Insulated Gate Bipolar Transistor), and a wafer mounting device for use in the manufacturing method.

BACKGROUND ART

Patent Document 1 discloses a technique in which after surface structures such as transistors are formed on a surface of an FZ wafer, a back surface of the wafer is ground. This grinding makes a central portion of the back surface of the wafer thinner than an outer peripheral portion. Thus, a rib portion is formed on an outer peripheral portion of the back surface of the wafer. The ground wafer is subjected to processes such as ion implantation and metal electrode film formation.

PRIOR ART

Patent Literature

Patent Literature 1: Japanese Patent Laid-Open No. 2009-283636
Patent Literature 2: Japanese Translation of PCT International Application Publication No. H10-500903

SUMMARY OF INVENTION

Problems to be Solved by the Invention

For example, in the case where a wafer is ground to a thickness of 100 μm or less, the wafer is warped by several millimeters to several tens of millimeters due to stress in an electrode film or the like. The warped wafer cannot be transferred. Accordingly, there are cases where an outer peripheral region of the wafer having a width of several millimeters is left without being ground to provide a ring portion thicker than a central portion of the wafer and reduce the warpage of the wafer.

In the case where a wafer is diced with a dicing blade, dicing tape is attached to the wafer. However, an attempt to attach a wafer having a ring portion to dicing tape creates a gap between the wafer and the dicing tape, and has adverse effects such as a decrease in the number of effective chips (the number of effective semiconductor elements).

The present invention has been made to solve the above-described problems, and an object of the present invention is to provide a semiconductor-element manufacturing method and a wafer mounting device which can dice a wafer without adverse effects such as a decrease in the number of effective chips.

Means for Solving the Problems

According to the present invention, there is provided a semiconductor-element manufacturing method including the steps of cutting out a ring portion of a wafer with laser light to form a flat wafer, the ring portion being formed on a periphery of the wafer and thicker than a central portion of the wafer, the wafer having a first surface and a second surface opposite to the first surface, with the first surface of the wafer being held on a vacuum stage by suction, attaching the first surface to dicing tape after detaching the flat wafer from the vacuum stage with the second surface of the flat wafer being held by a vacuum end-effector by suction, and dicing the flat wafer attached to the dicing tape.

According to the present invention, there is provided a wafer mounting device including a cutting unit forming a flat wafer, the cutting unit including a vacuum stage holding a first surface of a wafer by suction, the wafer having a ring portion formed on a periphery thereof and thicker than a central portion of the wafer, the wafer having a second surface opposite to the first surface and a laser oscillator cutting out the ring portion from the wafer with laser light, an attaching unit having dicing tape provided therein, and a vacuum end-effector moving the flat wafer from the vacuum stage and attaching the flat wafer to the dicing tape while holding the second surface of the flat wafer by vacuum suction.

Other features of the present invention will become clear from the following description.

Advantageous Effects of Invention

In this invention, a ring portion is removed from a wafer with laser light to form a flat wafer, and then the flat wafer is attached to dicing tape. Accordingly, a wafer can be diced without adverse effects.

DESCRIPTION OF THE EMBODIMENTS

Semiconductor-element manufacturing methods and wafer mounting devices according to embodiments of the present invention will be described with reference to the drawings. The same or corresponding components will be denoted by the same reference signs, and the repetition of explanation thereof may be omitted.

Embodiment 1

Figure 1:
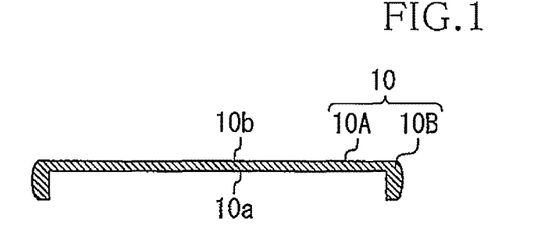
FIG. 1 is a cross-sectional view of a wafer.

A semiconductor-element manufacturing method according to embodiment 1 of the present invention will be described. FIG. 1 is a cross-sectional view of a wafer having a first surface 10a and a second surface 10b opposite to the first surface 10a. The wafer 10 has a central portion 10A and a ring portion 10B. The thickness of the central portion 10A is reduced to, for example, 100 μm or less by grinding the first surface 10a side of the central portion 10A. As surface structures of devices, elements such as transistors are formed on the second surface 10b side of the central portion 10A.

The ring portion 10B is a portion which is located around the central portion 10A and which is thicker than the central portion 10A. The ring portion 10B is formed in order to improve the strength of the wafer 10 and prevent the warpage of the wafer 10. It should be noted that wafers having thick portions on the peripheries thereof are called TAIKO (registered trademark) wafers.

Figure 2:
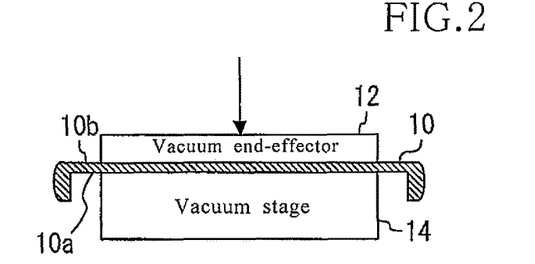
FIG. 2 is a cross-sectional view of a wafer and a vacuum stage.

FIG. 2 is a cross-sectional view showing the placing of the wafer 10 on a vacuum stage. The wafer 10 is moved with the second surface 10b of the wafer 10 being held by a vacuum end-effector 12 by suction to be placed on the vacuum stage 14. Thus, the first surface 10a of the wafer 10 comes into contact with the vacuum stage 14.

Figure 3:
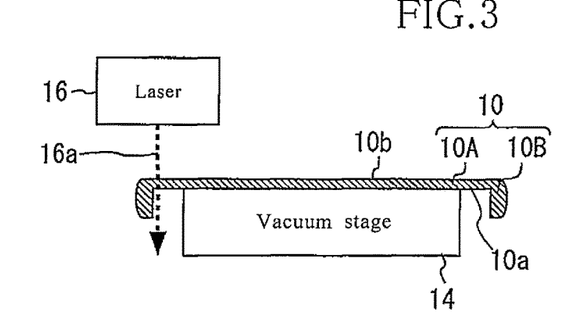
FIG. 3 is a view showing a laser oscillator, etc.

Subsequently, the ring portion 10B is removed. FIG. 3 is a cross-sectional view showing the removal of the ring portion 10B. In this step, the ring portion 10B is cut out from the wafer 10 using laser light 16a with the first surface 10a of the wafer 10 being held on the vacuum stage 14 by suction. At this time, the laser light 16a is applied to a boundary between the central portion 10A and the ring portion 10B. The laser light 16a is emitted from a laser oscillator 16. The laser oscillator 16 is preferably a YAG laser, but the present invention is not limited to this.

Figure 4:
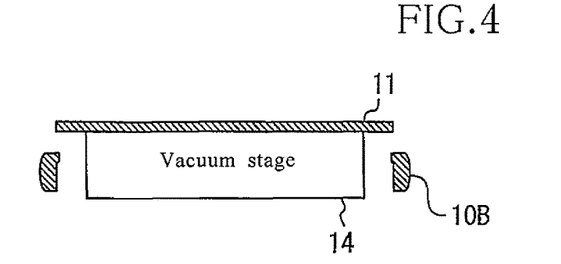
FIG. 4 is a cross-sectional view showing the wafer after the cutting step.

The step of cutting out the ring portion 10B from the wafer 10 as described above is referred to as a cutting step. FIG. 4 is a cross-sectional view showing the wafer after the cutting step. Since the ring portion 10B is cut out from the wafer 10 by the cutting step, only the central portion 10A remains. The wafer formed only by the central portion 10A to have a uniform thickness is referred to as a flat wafer 11.

Figure 5:
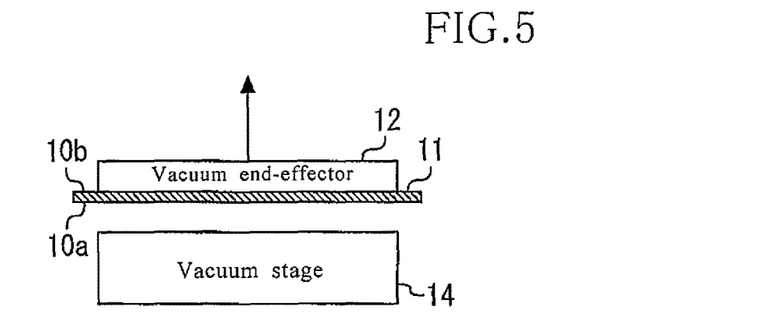
FIG. 5 is a view showing that the flat wafer is detached from the vacuum stage.

Then, as shown in FIG. 5, the flat wafer 11 is detached from the vacuum stage 14. Specifically, the flat wafer 11 is detached from the vacuum stage 14 with the second surface 10b of the flat wafer 11 being held by the vacuum end-effector 12 by suction. If the vacuum end-effector 12 is large enough to contact almost the entire area of the second surface 10b of the flat wafer 11, the flat wafer 11 can be prevented from warping by the vacuum end-effector 12.

Figure 6:
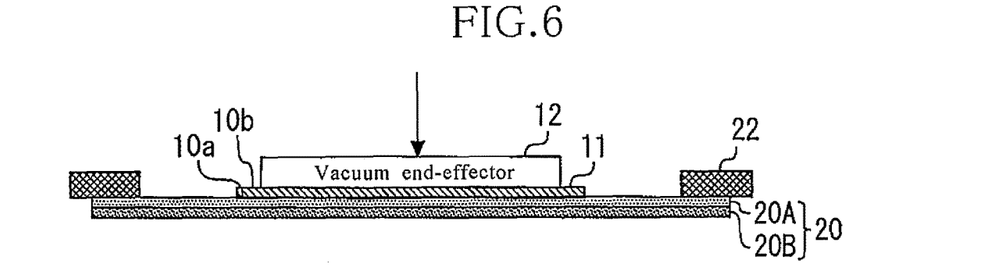
FIG. 6 is a cross-sectional view showing that the flat wafer is attached to dicing tape.

Subsequently, as shown in FIG. 6, the flat wafer 11 is attached to dicing tape 20. The dicing tape 20 has a structure in which an adhesive material 20A and a base material 20B stick together. The periphery of the dicing tape 20 is adhering to an annular mount frame 22. In this step, the first surface 10a of the flat wafer 11 is attached to the adhesive material 20A of the dicing tape 20. The step of detaching the flat wafer 11 from the vacuum stage 14 with the second surface 10b of the flat wafer 11 being held by the vacuum end-effector 12 by suction and attaching the first surface 10a to the dicing tape 20 as described above is referred to as an attaching step.

Figure 7:
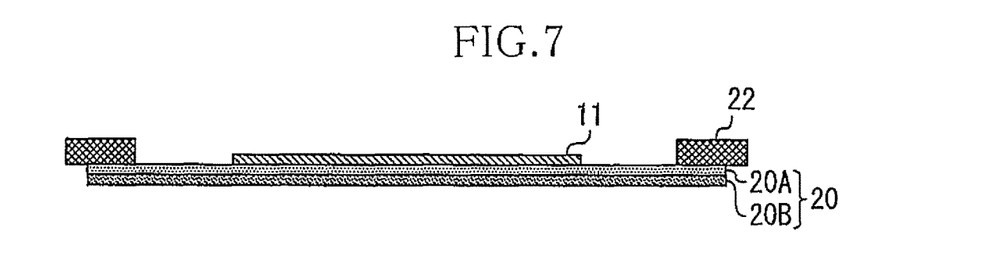
FIG. 7 is a cross-sectional view of structure to be diced.

After that, as shown in FIG. 7, the vacuum end-effector is retracted from the flat wafer 11. In this state, the flat wafer 11 does not warp because the flat wafer 11 is attached to the dicing tape 20. The structure shown in FIG. 7 in which the mount frame 22, the dicing tape 20, and the flat wafer 11 are integrated is referred to as a structure to be diced.

Figure 8:
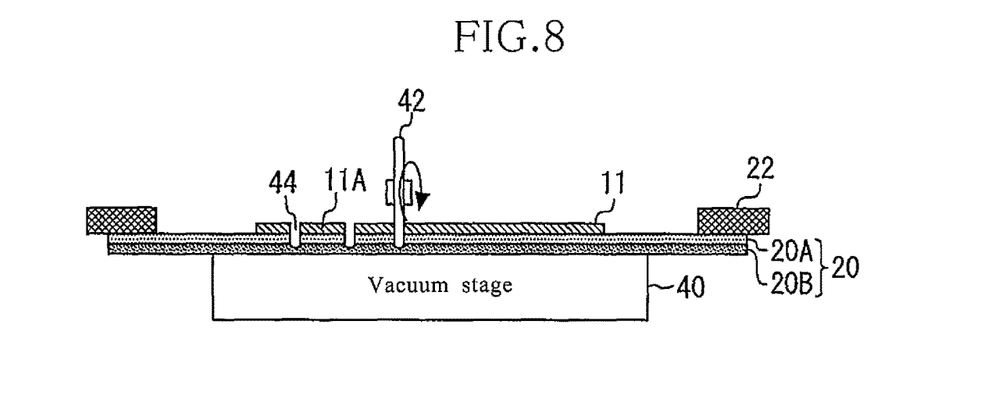
FIG. 8 is a cross-sectional view showing the dicing of the flat wafer.

Subsequently, as shown in FIG. 8, the flat wafer 11 attached to the dicing tape 20 is diced. This step is referred to as a dicing step. In the dicing step, first, the structure to be diced is placed on a vacuum stage 40 of a dicer. Then, the flat wafer 11 is diced with a dicing blade 42 with the dicing tape 20 being held on the vacuum stage 40 of the dicer by suction. Thus, the flat wafer 11 is divided into individual semiconductor elements 11A (chips). Further, the dicing blade 42 creates grooves 44 in the dicing tape 20.

Figure 9:
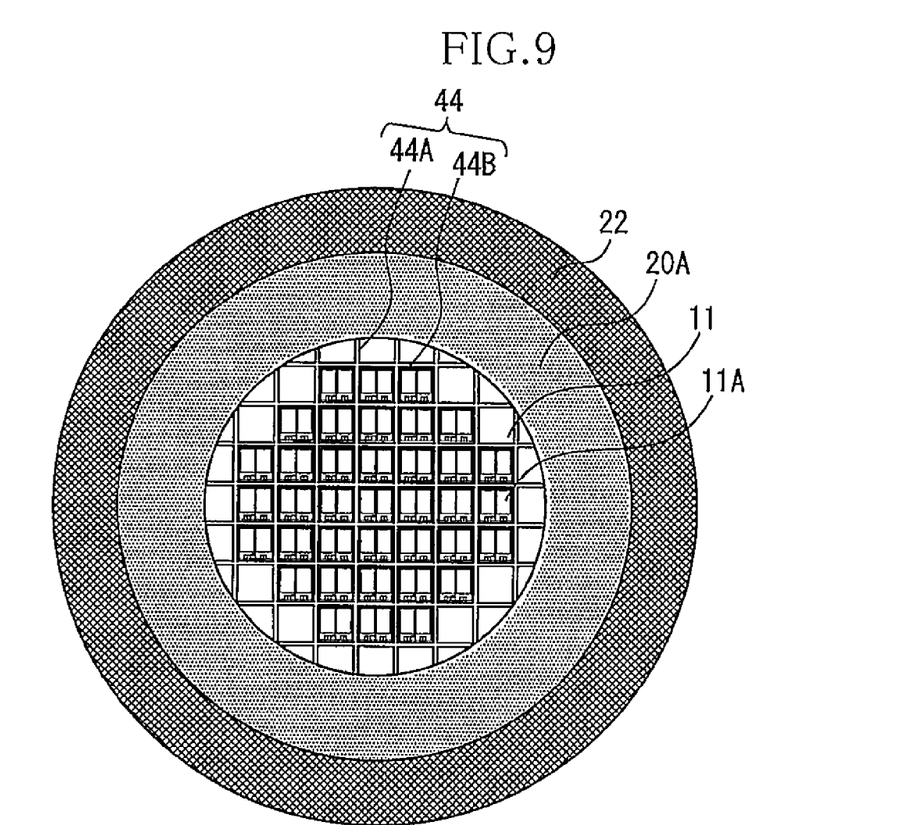
FIG. 9 is a plan view showing the wafer and the like after the dicing step.

FIG. 9 is a plan view showing the wafer and the like after the dicing step. Vertical grooves 44A and horizontal grooves 44B divide the flat wafer 11 into the individual semiconductor elements 11A. The semiconductor-element manufacturing method according to embodiment 1 of the present invention includes the above-described steps.

Figure 10:
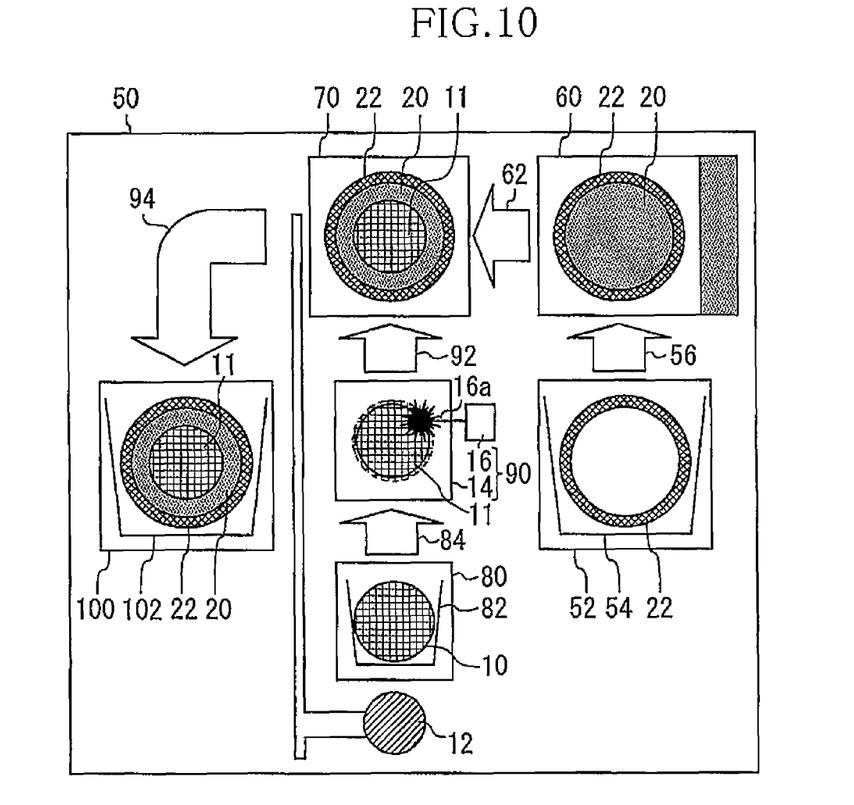
FIG. 10 is a plan view of a wafer mounting device according to the embodiment 1.

Next, a wafer mounting device as a device for forming a structure to be diced will be described. FIG. 10 is a plan view of a wafer mounting device 50. The wafer mounting device 50 is a device which mainly carries out the cutting step and the attaching step. The wafer mounting device 50 includes a stage 52. A mount frame cassette 54 for storing mount frames 22 is provided on the stage 52. A mount frame 22 in the mount frame cassette 54 is transferred to a dicing tape attaching unit 60. The transfer direction is indicated by an arrow 56.

The dicing tape attaching unit 60 is a place where the mount frame 22 is attached to the dicing tape 20. After the mount frame 22 is attached to the dicing tape 20, a peripheral portion of the dicing tape 20 is cut off. The mount frame 22 having the dicing tape 20 attached thereto is transferred to an attaching unit 70. The transfer direction is indicated by an arrow 62.

Before the attaching unit 70 will be described, wafer processing will be described. The wafer mounting device 50 includes a stage 80. A wafer cassette 82 for storing wafers 10 is provided on the stage 80. A wafer 10 in the wafer cassette 82 is transferred to a cutting unit 90 using the vacuum end-effector 12. The transfer direction is indicated by an arrow 84.

The cutting unit 90 includes a vacuum stage 14 and the laser oscillator 16. As described with reference to FIGS. 2 to 4, the cutting unit 90 cuts off the ring portion 10B. A flat wafer 11 with a uniform thickness formed by cutting off the ring portion 10B is held on the vacuum stage 14 and therefore does not warp.

The flat wafer 11 is transferred in the transfer direction indicated by an arrow 92. Specifically, the flat wafer 11 is moved from the vacuum stage 14 to the attaching unit 70 with the second surface 10b of the flat wafer 11 being held by the vacuum end-effector 12 by vacuum suction. In the attaching unit 70, the mount frame 22 having the dicing tape 20 attached thereto is waiting. As described with reference to FIG. 6, the flat wafer 11 is attached to the dicing tape 20. At this time, it is preferable that roller pressure, vacuum-air pressure, or the like is applied to the flat wafer 11 in the direction of the dicing tape 20 to cause the flat wafer 11 and the dicing tape 20 to stick together.

Thus, in the attaching unit 70, a structure to be diced is completed in which the mount frame 22, the dicing tape 20, and the flat wafer 11 are integrated. The structure to be diced is transferred to a stage 100. The transfer direction is indicated by an arrow 94. A cassette 102 for storing structures to be diced is provided on the stage 100. The structure to be diced is stored in the cassette 102, and processing by the wafer mounting device 50 is terminated.

Figure 11:
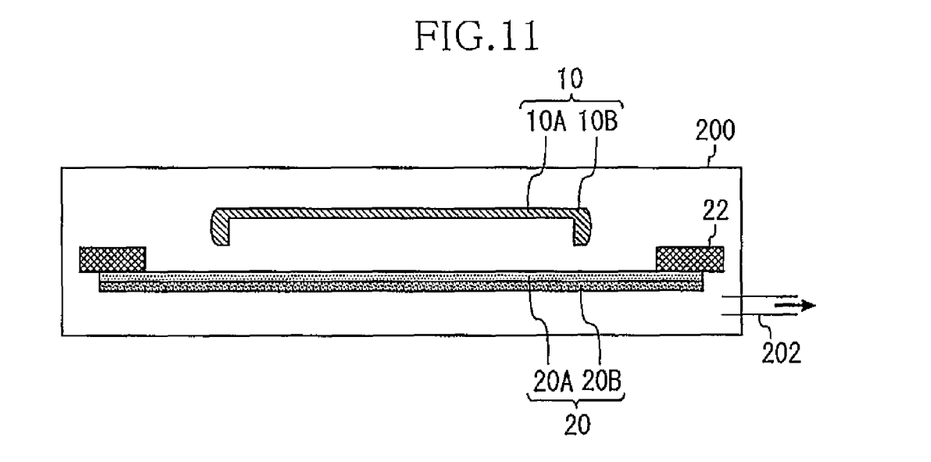
FIG. 11 is a view for explaining the comparative example.
Figure 12:
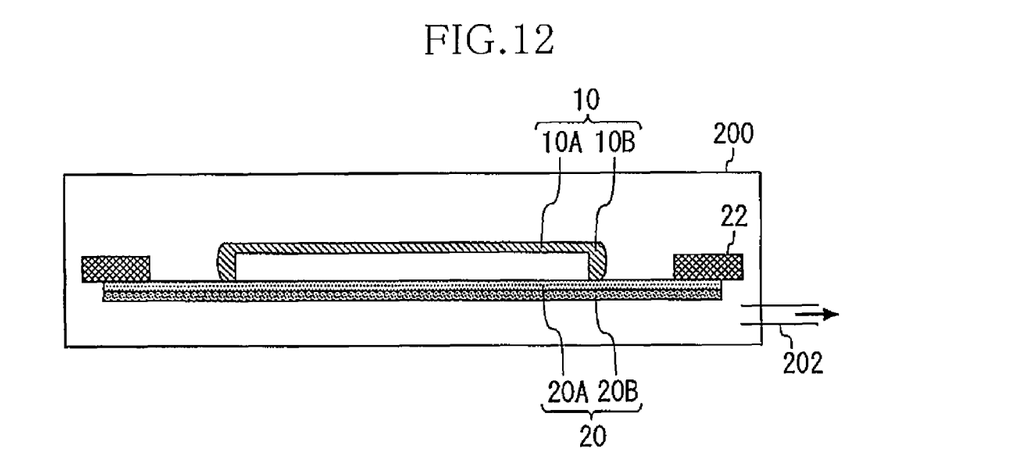
FIG. 12 is a view for explaining the comparative example.

Next, to facilitate the understanding of the meaning of the present invention, a comparative example will be described. In a semiconductor-element manufacturing method of the comparative example, first, as shown in FIG. 11, the mount frame 22 having the dicing tape 20 attached thereto and the wafer 10 are transferred into a chamber 200. Then, the chamber 200 is evacuated to a vacuum. The vacuum evacuation is performed by evacuating air from the inside of the chamber 200 through a duct 202 communicating with the chamber 200. When a vacuum is reached, the ring portion 10B of the wafer 10 and the dicing tape 20 are caused to stick together as shown in FIG. 12.

Figure 13:
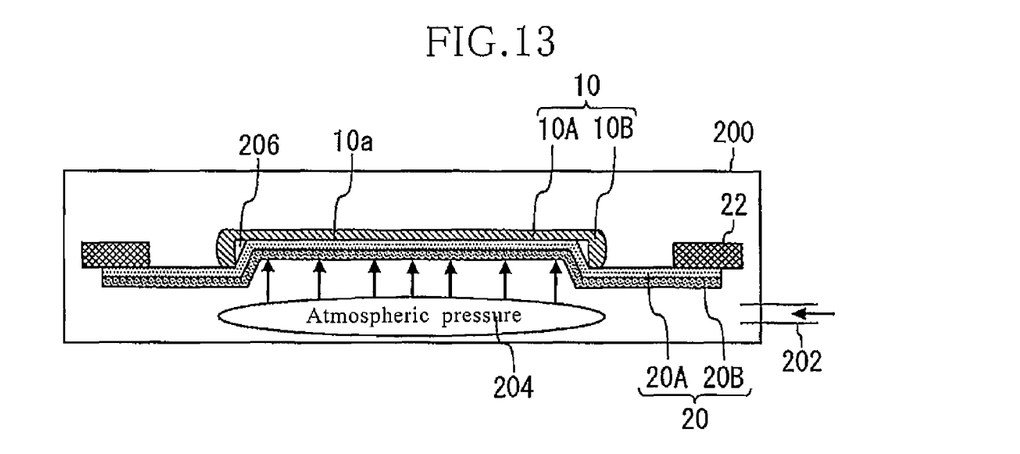
FIG. 13 is a view for explaining attaching dicing tape to the wafer in the comparative example.

Subsequently, the inside of the chamber 200 is returned to atmospheric pressure. Then, as shown in FIG. 13, the atmospheric pressure 204 causes the dicing tape 20 to adhere to the first surface 10a of the wafer 10. At this time, a gap 206 is created between a step portion of the wafer 10 and the dicing tape 20. In this way, a structure to be diced of the comparative example is completed. The structure to be diced of the comparative example includes the wafer 10 in which the ring portion 10B is not cut off.

Figure 14:
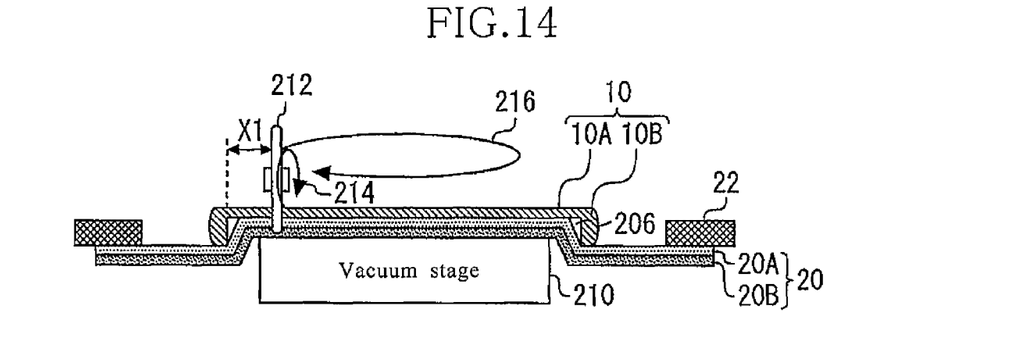
FIG. 14 is a view for explaining dicing in the comparative example.

Then, the ring portion 10B is cut off. Specifically, as shown in FIG. 14, the structure to be diced is placed on a vacuum stage 210, and the wafer 10 is circumferentially cut with a dicing blade 212. The direction of rotation of the dicing blade 212 is indicated by a direction 214, and the direction of travel thereof is indicated by a direction 216 (direction along the periphery of the wafer 10).

At this time, the vacuum stage 210 must be located immediately under the dicing blade 212. If the vacuum stage 210 is not located immediately under the dicing blade 212, the dicing blade 212 bends and breaks the wafer 10. Accordingly, in view of variation in the width of the ring portion 10B, the thickness of the dicing tape 20, misalignment between the centers of the vacuum stage 210 and the wafer 10, and the like, the cutting position must be inwardly spaced from the ring portion 10B by approximately a distance X1 (approximately 1.5 mm).

Thus, in the comparative example, when the ring portion 10B is cut off, part of the central portion 10A must also be cut off, and therefore the number of effective chips decreases accordingly. This problem is referred to as a first problem.

The first problem can be solved by the semiconductor-element manufacturing method according to embodiment 1 of the present invention. Specifically, in embodiment 1, since laser light is used, the ring portion 10B can be removed by cutting the boundary between the ring portion 10B and the central portion 10A. Accordingly, the ring portion 10B can substantially be cut off without cutting the central portion 10A, and therefore the number of effective chips does not decrease. This effect can be obtained by providing the laser oscillator 16 in the cutting unit 90 of the wafer mounting device 50 shown in FIG. 10.

Figure 15:
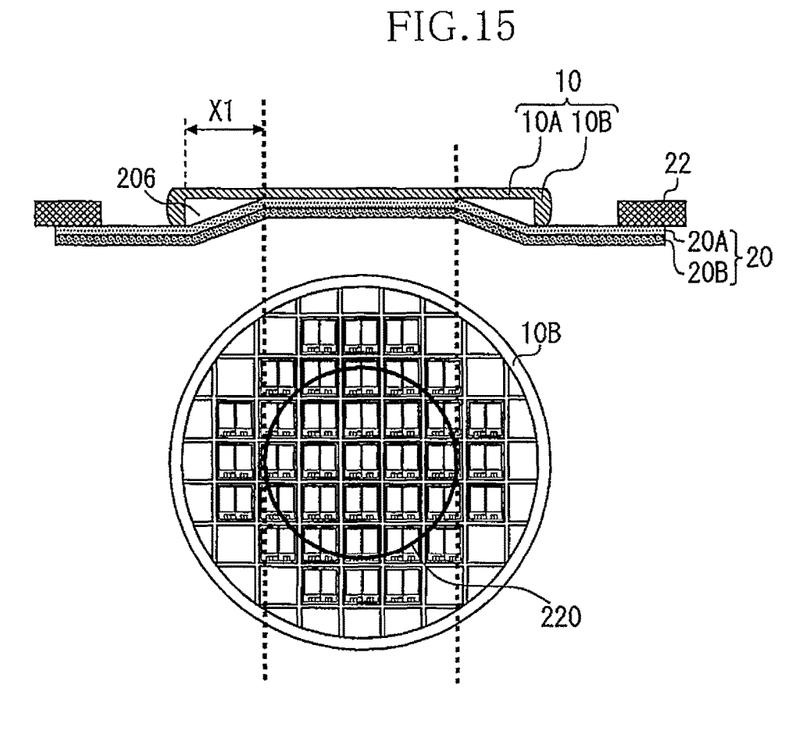
FIG. 15 is a view showing a gap in the comparative example.

In the comparative example, in the case where adhesion between the wafer 10 and the dicing tape 20 is low, a gap therebetween becomes large. FIG. 15 is a view showing a large gap 206 formed between the wafer 10 and the dicing tape 20. A cross-sectional view is shown in an upper portion of FIG. 15, and a plan view is shown in a lower portion of FIG. 15. In the case where the gap 206 is large, the distance X1 from the ring portion 10B to the cutting position must be increased, and therefore the number of effective chips decreases. Specifically, since only a portion surrounded by a circle 220 proceeds to the dicing step, many chips (semiconductor elements) go to waste. Moreover, the adhesion area between the wafer 10 and the dicing tape 20 becomes small, the wafer 10 is more likely to be knocked off during dicing. These problems caused by an increase in the size of the gap 206 are collectively referred to as a second problem.

The second problem can be solved by the semiconductor-element manufacturing method according to embodiment 1 of the present invention. Specifically, in embodiment 1, since the flat wafer 11 is attached to the dicing tape 20, there is no gap between the flat wafer 11 and the dicing tape 20. Accordingly, in the semiconductor-element manufacturing method according to embodiment 1, the second problem does not occur.

Figure 16:
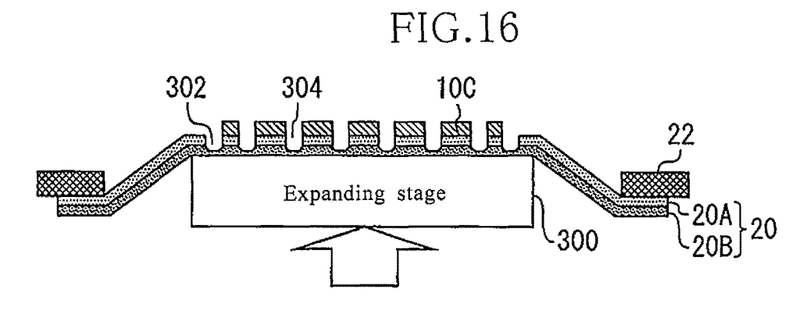
FIG. 16 is a view showing the expanding stage, etc. in the comparative example.

Generally, after a wafer is diced and divided into individual semiconductor elements, dicing tape is expanded (stretched) so that semiconductor elements can be easily picked up. FIG. 16 is a cross-sectional view showing the expansion of the dicing tape. Semiconductor elements 10C after singulation are bonded to the dicing tape 20. The dicing tape 20 has an annular groove 302 formed at the time of ring portion cutting and grooves 304 formed when the wafer 10 is divided into the individual semiconductor elements 10C. By lifting an expanding stage 300 to expand the dicing tape 20, the widths of dicing lines (grooves 304) are increased, and it becomes easy to pick up the semiconductor elements 10C.

Figure 17:
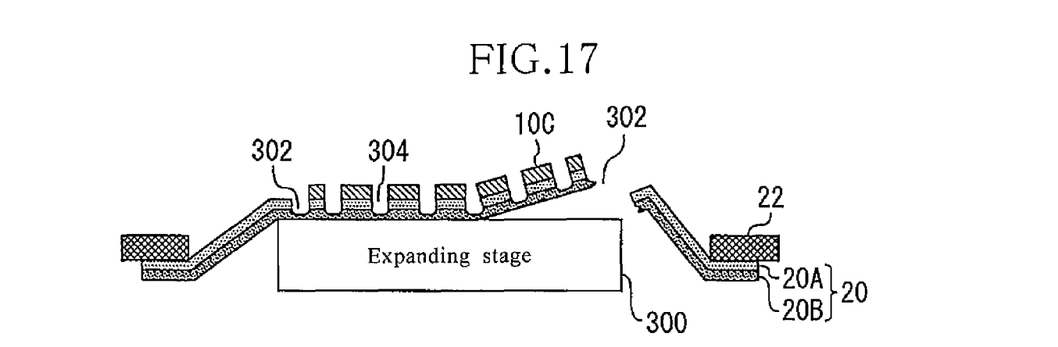
FIG. 17 is a view showing the dicing tape broken.

Since the groove 302 is formed in an annular shape and the expanding stage 300 also has a circular shape in planar view, forces concentrate on the groove 302 of the dicing tape 20 and the surrounding area at the time of expansion, and there are cases where the dicing tape 20 breaks along the groove 302. FIG. 17 is a cross-sectional view showing the dicing tape 20 broken along the groove 302. Naturally, a break of the dicing tape 20 makes it difficult to pick up the semiconductor elements 10C. This is referred to as a third problem.

The third problem can be solved by the semiconductor-element manufacturing method according to embodiment 1 of the present invention. Specifically, in embodiment 1, since the ring portion 10B is cut off before the wafer 10 is attached to the dicing tape 20, the dicing tape 20 has no annular groove formed by ring portion cutting. Accordingly, in the semiconductor-element manufacturing method of embodiment 1, the third problem does not occur.

As described above, in the semiconductor-element manufacturing method according to embodiment 1 of the present invention, the number of effective chips is larger than that of the comparative example, a wafer is not knocked off during dicing, and a break of the dicing tape 20 during expansion can be avoided.

In the case where the ring portion 10B is cut off before the wafer 10 is attached to the dicing tape 20, there is a concern that the flat wafer 11 may warp. However, in the cutting step of embodiment 1 of the present invention, since the ring portion 10B is cut out from the wafer 10 with laser light with the first surface 10a of the wafer 10 being held on the vacuum stage 14 by suction, the flat wafer 11 does not warp. Further, in the attaching step, the flat wafer 11 is detached from the vacuum stage 14 with the second surface 10b of the flat wafer 11 being held by the vacuum end-effector 12 by suction, and the first surface 10a is attached to the dicing tape 20. Accordingly, the flat wafer 11 does not warp. In this way, the, flat wafer 11 can always be held flat from the time when the ring portion 10B is cut off to the time when the flat wafer 11 is attached to the dicing tape 20.

As the laser oscillator 16, a YAG laser is preferably used which is easy to handle because of being a solid-state laser and which has a high efficiency and a long life. However, other laser element may be used as the laser oscillator 16. Moreover, in embodiment 1 of the present invention, a surface of the wafer 10 appearing as a result of grinding is treated as the first surface 10a, and a surface opposite thereto is treated as the second surface 10b. However, in the case where the surface appearing as a result of grinding is defined as a second surface and where the opposite surface is defined as a first surface, effects of the present invention can also be obtained when the above-described process is carried out. It should be noted that these modifications can also be applied to semiconductor-element manufacturing methods and wafer mounting devices according to embodiments below.

The semiconductor-element manufacturing methods and the wafer mounting devices according to the embodiments below have many things in common with those of embodiment 1, and therefore differences from embodiment 1 will be mainly described.

Embodiment 2

Figure 18:
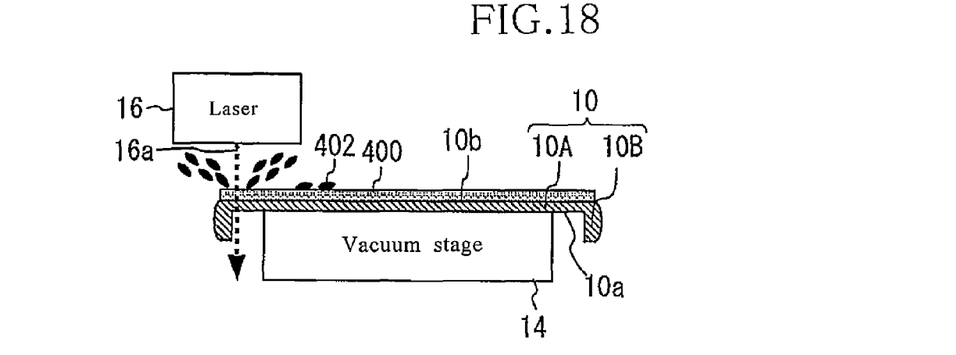
FIG. 18 is a view showing a cutting unit of a wafer mounting device according to embodiment 2.

FIG. 18 is a view showing a cutting unit of a wafer mounting device according to embodiment 2 of the present invention. In a cutting step using the cutting unit, first, a water-soluble protective film 400 is formed on the second surface 10b. After that, the ring portion 10B is cut out from the wafer 10 with the laser light 16a. The protective film 400 can prevent laser cutting dust 402 from adhering to the wafer 10.

Embodiment 3

Figure 19:
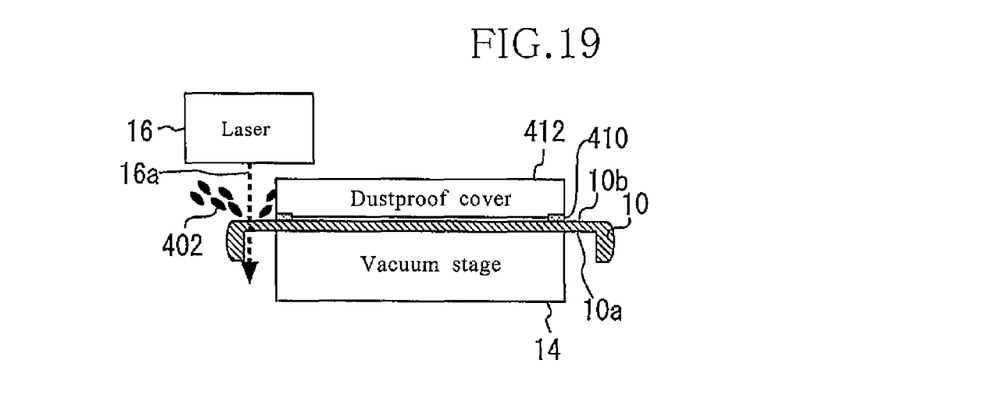
FIG. 19 is a view showing a cutting unit of a wafer mounting device according to embodiment 3.

FIG. 19 is a view showing a cutting unit of a wafer mounting device according to embodiment 3 of the present invention. In a cutting step using the cutting unit, first, a central portion of the second surface 10b is covered with a rubber ring 410 and a dustproof cover 412. After that, the ring portion 10B is cut out from the wafer 10 with the laser light 16a. The rubber ring 410 and the dustproof cover 412 can prevent laser cutting dust 402 from adhering to the wafer 10. Realizing this method requires a smaller number of steps than the formation of a water-soluble protective film on the second surface 10b.

Embodiment 4

Figure 20:
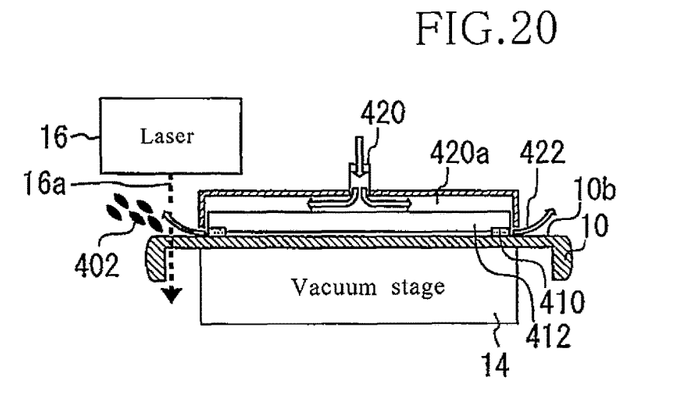
FIG. 20 is a view showing a cutting unit of a wafer mounting device according to embodiment 4.

FIG. 20 is a view showing a cutting unit of a wafer mounting device according to embodiment 4 of the present invention. In a cutting step using the cutting unit, first, a central portion of the second surface 10b is covered with the rubber ring 410 and the dustproof cover 412. After that, an airflow generator 420 is set so as to cover the rubber ring 410 and the dustproof cover 412. A hollow space 420a through which airflows flow in directions indicated by arrows is provided in the airflow generator 420. The airflow generator 420 generates airflows 422 passing through the hollow space 420a from the central portion of the second surface 10b to the peripheral portion. Further, while the airflows 422 are being generated, the ring portion 10B is cut out from the wafer 10 with the laser light 16a. This method can prevent laser cutting dust 402 from adhering to the edge of the wafer 10.

Embodiment 5

Figure 21:
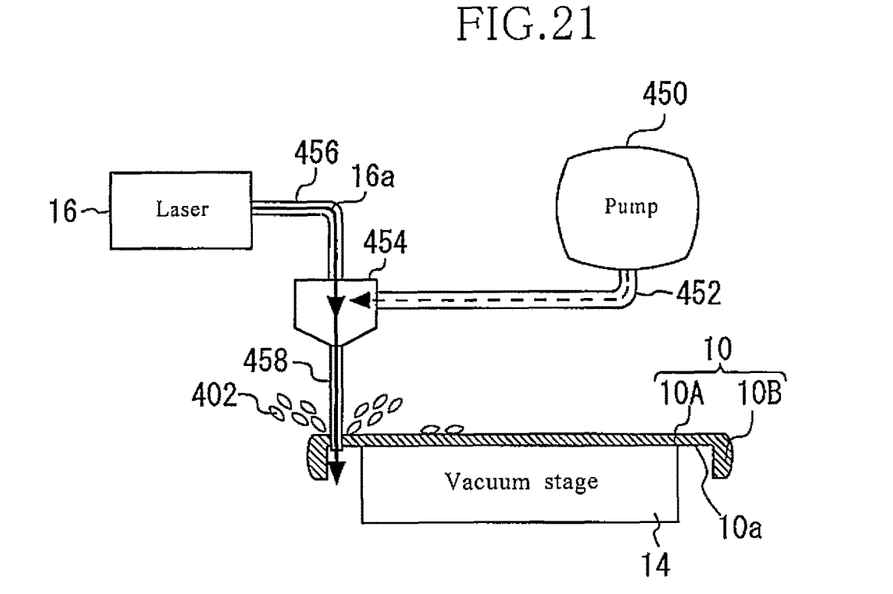
FIG. 21 is a view showing a cutting unit of a wafer mounting device according to embodiment 5.

FIG. 21 is a view showing a cutting unit of a wafer mounting device according to embodiment 5 of the present invention. The cutting unit includes a high-pressure water pump 450. A duct 452 is connected to the high-pressure water pump 450. A nozzle 454 is connected to the duct 452. This cutting unit is configured so that water emitted from the high-pressure water pump 450 is jetted onto the wafer 10 through the duct 452 and the nozzle 454. The diameter of a water column 458 jetted from the nozzle 454 is, for example, several tens of micrometers.

The laser light 16a emitted from the laser oscillator 16 is introduced into the water column 458 through an optical fiber 456 and the nozzle 454 and applied to the boundary between the central portion 10A and the ring portion 10B. In this way, in the cutting step, by jetting water (water column 458) onto a portion irradiated with the laser light, a temperature rise in the irradiated portion can be reduced. Moreover, this water can discharge laser cutting dust 402 to the outside.

Figure 22:
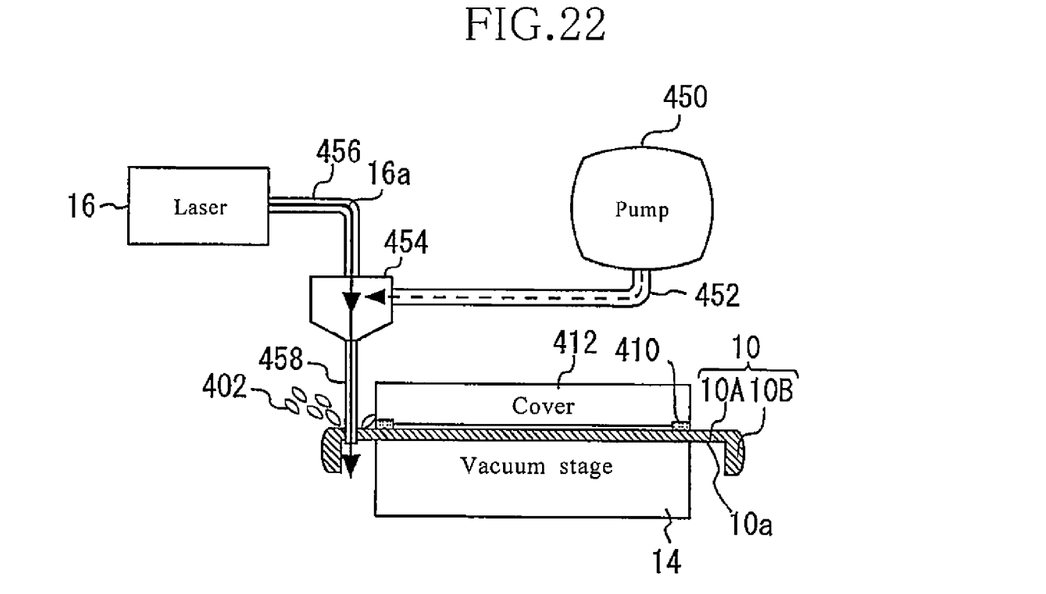
FIG. 22 is a view showing a cutting unit of the comparative example.
Figure 23:
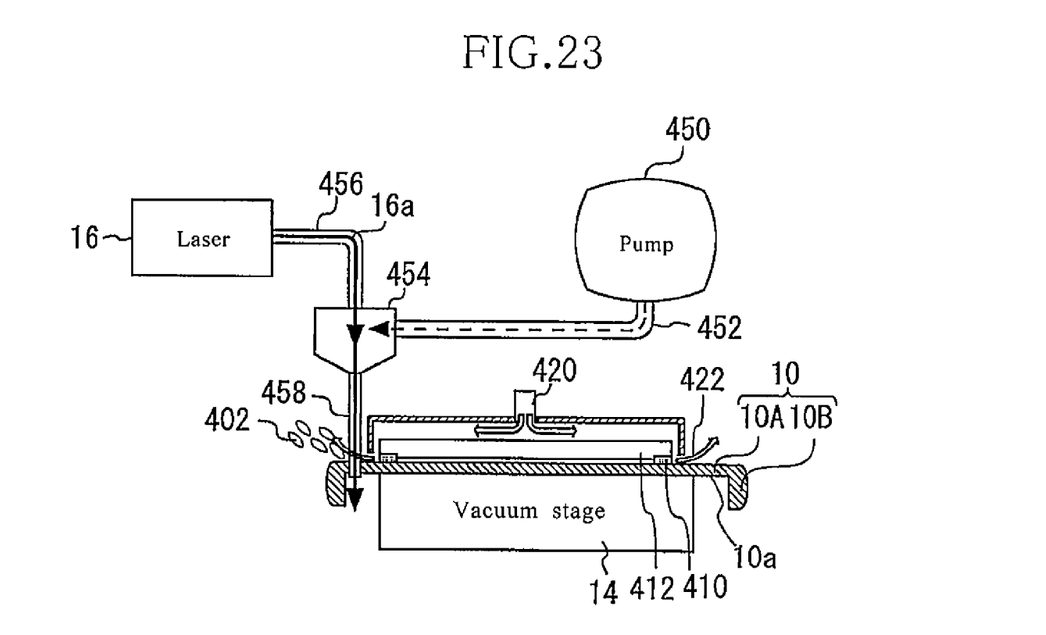
FIG. 23 is a view showing a cutting unit of the comparative example.

It should be noted that features of the semiconductor-element manufacturing methods and the wafer mounting devices according to the above-described embodiments may be appropriately combined to improve effects of the present invention. For example, as shown in FIG. 22, the rubber ring 410 and the dustproof cover 412 may be added to the configuration of embodiment 5. Moreover, as shown in FIG. 23, the rubber ring 410, the dustproof cover 412, and the airflow generator 420 may be added to the configuration of embodiment 5.

DESCRIPTION OF SYMBOLS 10 wafer, 10A central portion, 10B ring portion, 10C semiconductor element, 10a first surface, 10b second surface, 11 flat wafer, HA semiconductor element, 12 vacuum end-effector, 14 vacuum stage, 16 laser oscillator, 20 dicing tape, 20A adhesive material, 20B base material, 22 mount frame, 40 vacuum stage of dicer, 42 dicing blade, 44 groove, 50 wafer mounting device, 52 stage, 54 mount frame cassette, 60 dicing tape attaching unit, 70 attaching unit, 80 stage, 82 wafer cassette, 90 cutting unit, 100 stage, 102 cassette, 200 chamber, 202 duct, 206 gap, 300 expanding stage, 302, 304 groove, 400 protective film, 402 laser cutting dust, 410 rubber ring, 412 dustproof cover, 420 airflow generator, 422 airflows, 450 high-pressure water pump, 452 duct, 454 nozzle, 456 optical fiber

The invention claimed is:

1. A semiconductor-element manufacturing method comprising the steps of: cutting out a ring portion of a wafer with laser light to form a flat wafer, the ring portion being formed on a periphery of the wafer and thicker than a central portion of the wafer, the wafer having a first surface and a second surface opposite to the first surface, with the first surface of the wafer being held by the first vacuum stage by suction;

using a vacuum end-effector on the second surface of the flat wafer to detach the cut flat wafer from the first vacuum stage and attach the first surface of the flat wafer to a dicing tape;

transporting and attaching the first surface of the flat wafer to a second vacuum stage via the dicing tape; and dicing the flat wafer attached to the dicing tape.

2. The semiconductor-element manufacturing method according to claim 1, wherein in the cutting step, a YAG laser is used.

3. The semiconductor-element manufacturing method according to claim 1, wherein in the cutting step, water is jetted onto a portion irradiated with the laser light.

4. The semiconductor-element manufacturing method according to claim 1, wherein in the cutting step, the laser light is applied to a boundary between the central portion and the ring portion.

5. A semiconductor-element manufacturing method comprising the steps of:

cutting out a ring portion of a wafer with laser light to form a flat wafer, the ring portion being formed on a periphery of the wafer and thicker than a central portion of the wafer, the wafer having a first surface and a second surface opposite to the first surface, with the first surface of the wafer being held on a vacuum stage by suction;

attaching the first surface to dicing tape after detaching the flat wafer from the vacuum stage with the second surface of the flat wafer being held by a vacuum end-effector by suction; and dicing the flat wafer attached to the dicing tape, wherein in the cutting step, the ring portion is cut out from the wafer after a water-soluble protective film is formed on the second surface.

6. A semiconductor-element manufacturing method comprising the steps of:

cutting out a ring portion of a wafer with laser light to form a flat wafer, the ring portion being formed on a periphery of the wafer and thicker than a central portion of the wafer, the wafer having a first surface and a second surface opposite to the first surface, with the first surface of the wafer being held on a vacuum stage by suction;

attaching the first surface to dicing tape after detaching the flat wafer from the vacuum stage with the second surface of the flat wafer being held by a vacuum end-effector by suction; and dicing the flat wafer attached to the dicing tape, wherein in the cutting step, the ring portion is cut out from the wafer after a central portion of the second surface is covered with a rubber ring and a dustproof cover.

7. A semiconductor-element manufacturing method comprising the steps of:

cutting out a ring portion of a wafer with laser light to form a flat wafer, the ring portion being formed on a periphery of the wafer and thicker than a central portion of the wafer, the wafer having a first surface and a second surface opposite to the first surface, with the first surface of the wafer being held on a vacuum stage by suction;

attaching the first surface to dicing tape after detaching the flat wafer from the vacuum stage with the second surface of the flat wafer being held by a vacuum end-effector by suction; and dicing the flat wafer attached to the dicing tape, wherein in the cutting step, the ring portion is cut out from the wafer while airflows from a central portion of the second surface to a peripheral portion thereof are being generated.

8. A wafer mounting device comprising:

a cutting unit forming a flat wafer, the cutting unit comprising:

a vacuum stage holding a first surface of a wafer by suction, the wafer having a ring portion formed on a periphery thereof and thicker than a central portion of the wafer, the wafer having a second surface opposite to the first surface; and a laser oscillator cutting out the ring portion from the wafer with laser light;

an attaching unit having dicing tape provided therein; and a vacuum end-effector moving the flat wafer from the vacuum stage and attaching the flat wafer to the dicing tape while holding the second surface of the flat wafer by vacuum suction.

* * * * *